(12) United States Patent
Grosch et al.

(10) Patent No.: US 12,744,396 B2
(45) Date of Patent: Sep. 22, 2026

(54) ARRANGEMENT FOR REDUNDANT CONTROL SYSTEM

(71) Applicant: Siemens Aktiengesellschaft, Munich (DE)

(72) Inventors: Thomas Grosch, Roßtal (DE); Albert Renschler, Ettlingen (DE)

(73) Assignee: Siemens Aktiengesellschaft, Munich (DE)

( * ) Notice: Subject to any disclaimer, the term of this patent is extended or adjusted under 35 U.S.C. 154(b) by 1120 days.

(21) Appl. No.: 17/854,039

(22) Filed: Jun. 30, 2022

(65) Prior Publication Data

US 2023/0006452 A1 Jan. 5, 2023

(30) Foreign Application Priority Data

Jul. 1, 2021 (EP) .................................... 21183053

(51) Int. Cl.
*H02J 1/102* (2026.01)
*H01M 50/204* (2021.01)
(Continued)

(52) U.S. Cl.
CPC ............. *H02J 7/56* (2026.01); *H01M 50/204* (2021.01); *H05K 7/1482* (2013.01); *H05K 7/1484* (2013.01)

(58) Field of Classification Search
CPC ... H02J 7/0019; H05K 7/1484; H05K 7/1482; G05B 9/03
(Continued)

(56) References Cited

U.S. PATENT DOCUMENTS 5,319,074 A 6/1994 Reddig et al.
6,654,265 B2 * 11/2003 Sadler .................... H02J 9/062 713/300

(Continued)

FOREIGN PATENT DOCUMENTS

CN 101136557 3/2008
CN 102104277 6/2011

(Continued)

OTHER PUBLICATIONS

Ni Jiachun et al, "A brief discussion on the construction of a modular stable power supply system based on emergency power supply", China Equipment Engineering, 04, Feb. 25, 2020.

(Continued)

*Primary Examiner* — Rexford N Barnie
*Assistant Examiner* — Joshua James Sweet
(74) *Attorney, Agent, or Firm* — Cozen O'Connor

(57) ABSTRACT

An arrangement that includes a first rack formed with a plurality of slots for receiving individual assemblies that form a first automation system, and a second rack formed with further pluralities of slots for receiving further individual assemblies that form a second automation system, wherein a slot of the first rack forms a first supply module receptacle, and a slot of the second rack is formed as a second supply module receptacle, where the first and second supply module receptacles are constructed to structurally/electrically complement one another between the first rack and the second rack to form a supply base module, the first contact supplies the first and second racks with a supply voltage and the second contact supplies the second and the first rack with the supply voltage, and the supply base module formed by the supply module receptacles receives a first, second and third supply voltage modules.

7 Claims, 4 Drawing Sheets

(51) Int. Cl.

| | |
|---|---|
| ***H02J 1/08*** | (2026.01) |
| ***H02J 7/56*** | (2026.01) |
| ***H02J 105/30*** | (2026.01) |
| ***H05K 7/14*** | (2006.01) |

(58) Field of Classification Search

USPC .......................................................... 320/118

See application file for complete search history.

(56) References Cited

U.S. PATENT DOCUMENTS

| | | | | |
|---|---|---|---|---|
| 2010/0133901 | A1* | 6/2010 | Zhang | H02M 5/458 363/35 |
| 2012/0299376 | A1* | 11/2012 | Schaefer | F03D 9/25 320/101 |
| 2016/0006351 | A1 | 1/2016 | Augesky et al. | |
| 2016/0054381 | A1 | 2/2016 | Wakan et al. | |
| 2018/0034280 | A1* | 2/2018 | Pedersen | E21B 41/00 |
| 2018/0159315 | A1* | 6/2018 | Aagesen | H02H 7/268 |
| 2020/0033840 | A1* | 1/2020 | Balasubramanian | G05B 9/03 |
| 2021/0194273 | A1 | 6/2021 | Huang et al. | |
| 2022/0050451 | A1* | 2/2022 | Stay | G05B 23/0291 |
| 2022/0355944 | A1* | 11/2022 | Biaujaud | H02J 1/108 |

FOREIGN PATENT DOCUMENTS

| | | |
|---|---|---|
| CN | 104081614 | 10/2014 |
| CN | 108539744 | 9/2018 |
| CN | 110445247 | 11/2019 |
| CN | 112910079 | 6/2021 |
| EP | 0497174 | 8/1992 |
| EP | 0915400 | 5/1999 |
| EP | 2544058 B1 | 4/2016 |
| EP | 2982018 | 6/2021 |

OTHER PUBLICATIONS

Ma Ji Ming "Application of Siemens Redundant PLCS in the Air Compressor System of Power Plant", Guohua Panshan Generation Power Co., Ltd.; Tianjin 301900; China, Jan. 16, 2009.

EP Search Report dated Dec. 15, 2021 based on EP21183053 filed Jul. 1, 2021.

* cited by examiner

FIG 1
Stand der Technik 18
21
AP1
VG
AP2
17
22
K1
K2
SVG1
AP3
SVG2

1
SVG1
SVG2
2
PS3
VL1
VL2
K1
K2
PS1
PS2

SVG1
T
SVG2
K1
AP3'
K2
AP3
AP1
AP2

1
2
UM
S1
S2
SM1
SM2
PS1
PS2
VL1
VL2
VG
SVG1
PS3
SVG2

ARRANGEMENT FOR REDUNDANT CONTROL SYSTEM

BACKGROUND OF THE INVENTION

1. Field of the Invention

The invention relates to an arrangement for a redundant control system, which includes a first rack which is formed with a plurality of slots for receiving individual assemblies, which form a first automation system when assembled in a modular manner, and additionally includes a second rack with a further plurality of slots for receiving further individual assemblies, which likewise form a second automation system when assembled in a modular manner.

The invention additionally relates to high-availability automation devices where. as a general rule. two automation devices run in parallel and control a process, such that should one automation system fail then, as a general rule, the other automation system assumes control in a smooth manner.

2. Description of the Related Art

The goal of the platform independent Open Platform Communications OPC Unified Architecture (OPC UA) protocol and its information models is to facilitate standardized and interoperable communication for industrial automation. The interoperability in this context is the ability of industrial automation systems (or their parts of) to exchange data with unambiguous, shared meaning. This characteristic greatly reduces implementation effort and enables communication with cross-manufacturer industrial equipment. Apart from this, applications that operate on data from industrial equipment can be developed independently from the equipment, no matter where in an architecture the applications execute. The only prerequisite for communication with an industrial automation system is to use the OPC UA communication interface and its standardized information model. In order to feature the standardized and interoperable communication, new industrial automation systems may be designed to be compliant with the OPC UA standard.

EP 0 497 174 A1 discloses a method and an apparatus for operating an automation system with a redundant construction consisting of two subsystems.

In order to supply power or voltage, these two subsystems require a power supply assembly. In order to also increase the availability of the power supply, as a general rule two redundantly operating power supply assemblies can be or are also used in each subsystem.

With two power supply assemblies, it is possible for a redundant power supply of a rack to be constructed. In order to also construct a redundant power supply for the second rack, this likewise must be populated with two redundant power supply assemblies. This kind of power supply redundancy is always recommended if the availability of the controller is to be improved further still, particularly if the controllers are to be operated on an unreliable network.

In accordance with the known prior art, as a general rule two racks are installed in redundant automation systems, where the racks are either installed in one control cabinet or in control cabinets that are separate from one another. Particularly in the redundant automation system, the redundancy of the power supply of the racks is of additional importance. A fault in the power supply assembly should not lead to the failure of the rack. In this context, redundant power supplies are mostly implemented by plugging additional, redundant power supply assemblies into the rack. In a redundant automation system which is mounted in a control cabinet, in this context four power supply assemblies are plugged in within immediate spatial proximity to one another, for example. The slots required for this purpose then can no longer be used for other assemblies in the rack.

In conventional automation systems or the racks thereof which are designed in a duplicate manner, it is disadvantageous that the space available for additional assemblies, such as in the control cabinet, is reduced, because two slots must be sacrificed for a redundant power supply at least for each automation system or for each of the racks.

SUMMARY OF THE INVENTION

It is an object of the present invention to provide an arrangement of racks that enables power supply redundancy and nevertheless requires fewer slots for the redundant power supply assemblies.

This and other objects and advantage are achieved in accordance with the invention by an arrangement in which a slot of a first rack is formed as a first supply module receptacle with a first contact structure, and a slot of a second rack is formed as a second supply module receptacle with a second contact structure, where the first and the second supply module receptacle are constructed such that they structurally and electrically complement one another from a perspective between the first rack and the second rack to form a supply base module, where the first contact structure is configured to supply the first and the second rack with a supply voltage and the second contact structure is configured to supply the second and the first rack with a supply voltage, and the supply base module formed by the supply module receptacles is configured to receive a first supply voltage module, a second supply voltage module and a third supply voltage module.

The object of the invention is thus achieved by modularizing the power supply assemblies that were previously used in a monolithic manner, where the modularization of the power supply assemblies now enables a more efficient construction of the racks and thus a more effective use of space in a control cabinet. In accordance with the invention, the power supply assembly has now been modularized, where for a start a supply module receptacle, a contact structure and a supply base module with corresponding receiving spaces for the supply voltage modules are available as a kind of assembly system.

If, in the case of two racks, there is likewise a desire for a redundant power supply, then a constituent part of the rack is configured such that both racks can be contacted with respect to a supply voltage. Accordingly, a slot is formed as a first supply module receptacle. It is possible for a supply voltage module for supplying the rack to be plugged into the supply module receptacle. In this context, the contact structure is configured such that both a left-hand rack and also a right-hand rack can be supplied with a supply voltage.

If the racks are arranged such that they stand directly adjacent to one another and if a supply base module was formed from the individual supply module receptacles, then three supply voltage modules can be plugged in. In this context, all three supply voltage modules are capable of supplying both racks with a supply voltage in a secure manner. It is considered to be a particular advantage that the supply voltage modules can be replaced on an individual basis during ongoing operation. What is known as a “two out of three” redundancy (2oo3) is produced for the power supply of the two racks. Each of the three supply voltage modules could now fail, without there being any risk to the power supply of both racks.

With respect to a high-availability control of an industrial process, it is advantageous if the first automation system and the second automation system are each established as a system for increasing the fail-safe operation via a change-over function between the two automation systems in the event of a failure on one side of an automation system.

However, should a complete failure of the system be caused and both automation systems must restart again, then it is advantageous if the arrangement is provided with a monitor, which is configured to record a current system state of each of the two automation systems, where the monitor is furthermore configured, following a failure of the two automation systems, to support a prioritized startup of the automation system for which a temporally more recent system state is available.

In many application cases, the redundant automation system should restart after turning on the power supply with the most recent system state. The most recent system state possibly differs between the automation devices of the two racks, if for example the power supplies thereof have failed at different points in time.

Furthermore, it is advantageous if the supply base module is constructed in a divisible manner, which makes it possible to "swap out" or replace a rack during operation without the respective other automation system failing.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

On the basis of the drawings, the invention is explained in further detail in an exemplary embodiment, in which:

FIG. 1 shows an arrangement with a rack in accordance with the prior art;

Figures 5, 6:
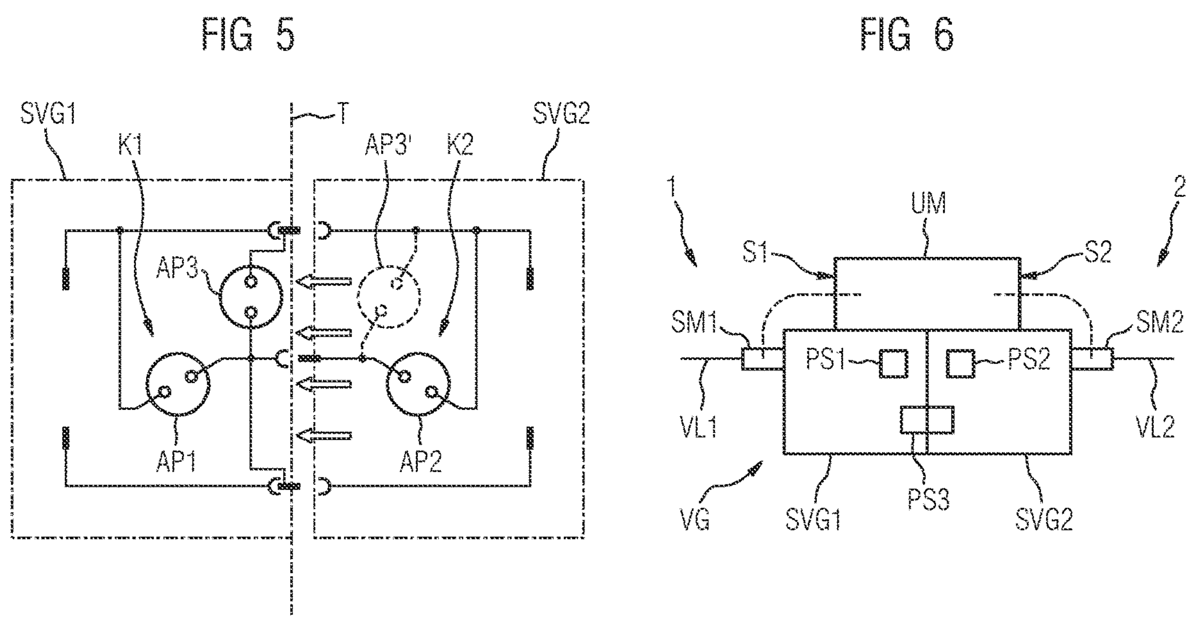

FIG. 5 likewise shows the interconnection of the contact structure with a representation of the receiving spaces in accordance with the invention; and FIG. 6 shows the supply base module with an additional monitor in accordance with the invention.

DETAILED DESCRIPTION OF THE EXEMPLARY EMBODIMENTS

Figure 1:
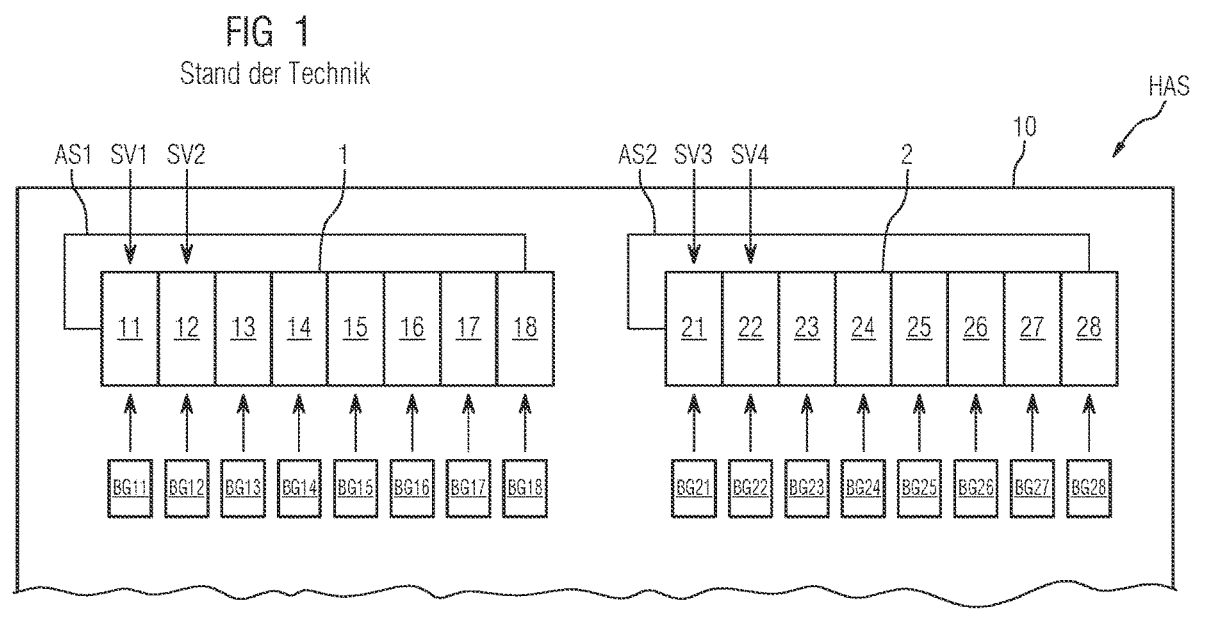

An arrangement HAS with a first rack 1 and a second rack 2 is shown in FIG. 1. The first rack 1 has a plurality of slots 11, . . . , 18 for receiving individual assemblies BG11, . . . , BG18. The assemblies BG11, . . . , 18 for the first rack 1 can be assembled in a modular manner to form a first automation system AS1. In a second rack 2 with further slots 21, . . . , 28 for receiving further individual assemblies BG21, . . . , 28, a second automation system AS2 can likewise be assembled in a modular manner using these. The first automation system AS1 and the second automation system AS2 are formed in a redundant manner as high-availability automation systems.

Plugged into the first slot 11 of the first rack 1 is a first supply unit SV1; in order for a supply to be designed in a redundant manner for the first rack 1, a further second supply unit SV2 is plugged into the second slot 12 of the first rack 1.

The second automation system AS2 in the second rack 2 is provided so as to also obtain a redundant power supply. Accordingly, a third supply unit SV3 is plugged into the first slot 21 of the second rack 2; since the second automation system AS2 is also to be formed in a redundant manner in relation to a power supply, a fourth supply unit SV4 is plugged into the second slot 22 of the second rack 2.

In redundant automation systems that are mounted in a control cabinet 10, four slots are now required in order to implement the two automation systems AS1,AS2 with a redundant power supply.

In the first rack 1, two slots, i.e., the first slot 11 and the second slot 12, are required for every one supply unit SV1,SV2. In the second rack 2, one supply unit SV3,SV4 is required at the first slot 21 and the second slot 22 in each case. This means that four slots are required, which now can no longer be used for other assemblies in the rack.

Figure 2:
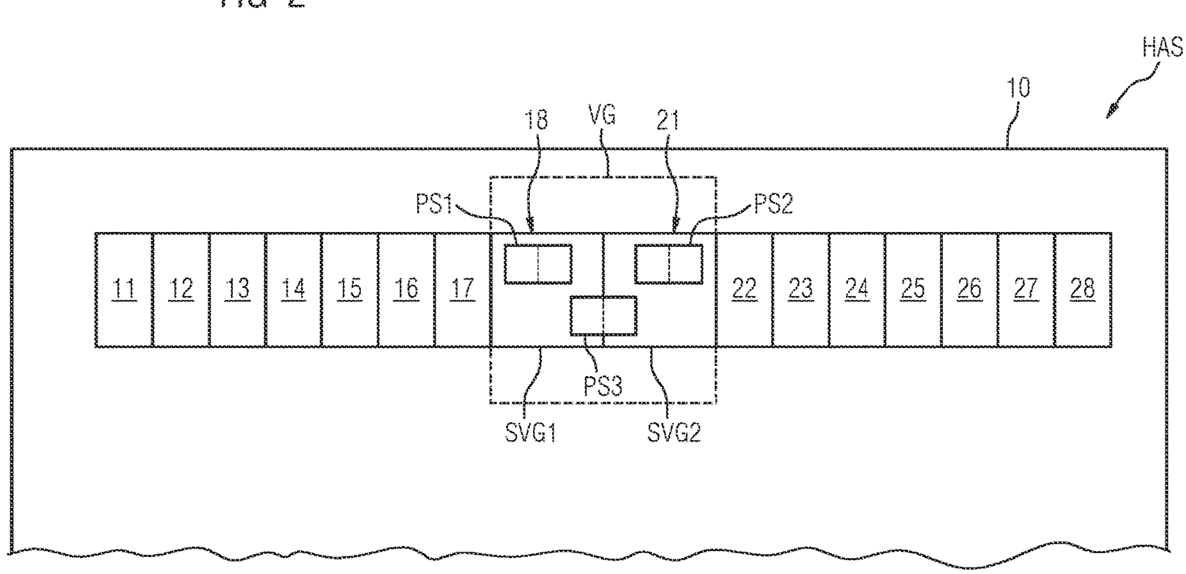
FIG. 2 shows an arrangement with the improved racks in accordance with the invention.

As illustrated in FIG. 2, a solution is presented for saving slots for the arrangement HAS (High-Availability System) with the first rack 1 and the second rack 2. To this end, a slot 18 of the first rack 1 is formed as a first supply module receptacle SVG1 with a first contact structure K1. Furthermore, in the second rack 2 a first slot 21 is formed as a second supply module receptacle SVG2 with a second contact structure K2. The first and the second supply module receptacle SVG1,SVG2 are constructed such that they structurally and electrically complement one another from a perspective between the first rack 1 and the second rack 2 to form a supply base module VG. The first contact structure K1 is configured to supply the first and the second rack 1,2 with a supply voltage. The second contact structure K2 is configured to supply the second and the first rack 2,1 with a supply voltage. The supply base module VG formed by the supply module receptacles SVG1,SVG2 is furthermore configured to receive a first supply voltage module PS1, a second supply voltage module PS2 and a third supply voltage module PS3.

Figures 3, 4:
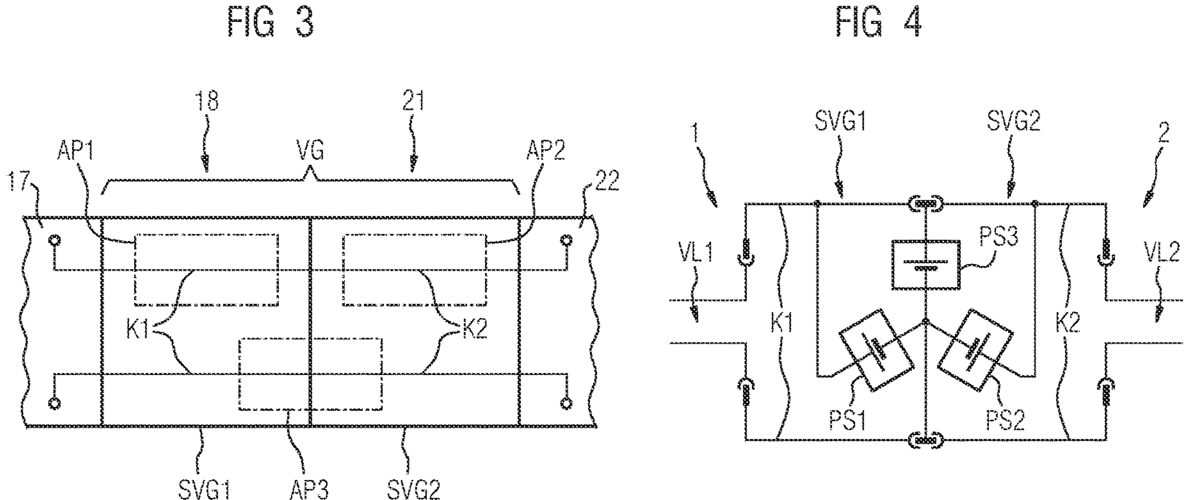
FIG. 3 shows a partial view of the rack at the supply module receptacles in accordance with the invention.
FIG. 4 shows an interconnection of the contact structure in accordance with the invention.

FIG. 3 shows a more detailed representation of the supply base module VG. The first supply module receptacle SVG1 is mechanically latched to the second supply module receptacle SVG2. The first supply module receptacle SVG1 has a first contact structure K1, which on the left-hand side is adapted at the first rack in the seventh slot 17 and on the right-hand side is contacted with a second contact structure K2 via the second supply module receptacle SVG2, and thus on the right-hand side ensure a voltage or power supply at the second slot 22 of the second rack 2. A first receiving space AP1 is incorporated into the first supply module receptacle SVG1. A second receiving space AP2 is incorporated into the second supply module receptacle SVG2. A third receiving space AP3 is partially incorporated into the first supply module receptacle SVG1 and partially into the second supply module receptacle SVG2.

FIG. 4 shows a possible interconnection of the first supply voltage module PS1, the second supply voltage module PS2 and the third supply voltage module PS3. To this end, the supply voltage modules PS1,PS2,PS3 plug into their respective receiving spaces AP1,AP2,AP3.

On the left-hand side, a contacting in the first rack 1 ensures the connection to a first supply line VL1. On the right-hand side, a contacting to a connection in the second rack 2 ensures a second supply line VL2. The supply voltage modules PS1,PS2,PS3 are combined in a neutral point with their negative pole, for example. The neutral point is then guided to a lower contact line of the two contact structures K1,K2. The respective positive points of the supply voltage modules PS1,PS2,PS3 are then guided to an upper contact line of the contact structures K1,K2. In order for the first supply module receptacle SVG1 and the second supply module receptacle SVG2 to be able to be separated, the separation points are formed with plug contacts.

FIG. 5 once again shows the separation of the first supply module receptacle SVG1 and the second supply module receptacle SVG2. At a separation point T, the first supply module receptacle SVG1 can be plugged into the second supply module receptacle SVG2 via plug contacts. The circles with their contact points represent the receiving spaces AP1,AP2,AP3 for the supply voltage modules PS1, PS2,PS3.

The divisible embodiment of the supply base module VG makes it possible to swap a defective rack 1,2 during operation, without the respective other automation system AS1,AS2 failing. Supply of voltage by at least one supply voltage module PS1,PS2,PS3 to the respective automation system that is not to be swapped is thus always ensured.

As a further improvement, a further receiving space AP3' could be integrated into the second supply module receptacle SVG2. This receiving space AP3' is normally not populated, because only three supply voltage modules PS1, PS2,PS3 are necessary. When separating the two racks 1,2, via the further receiving space AP3', one supply voltage module PS1,PS2,PS3 can be shifted before disassembly, in FIG. 5 from left to right. As a result, it becomes possible to always ensure the remaining rack is supplied in a redundant manner, i.e., with two supply voltage modules.

FIG. 6 shows a continuation, where using a monitor UM, which is configured to record a current system state of each of the two automation systems AS1,AS2, to monitor the system states of the two automation devices. The monitor UM is furthermore configured, following a failure of the two automation systems AS1,AS2, to support a prioritized startup of the automation system AS1 for which a temporally more recent system state S1,52 is available. To this end, the monitor UM actuates either a first switch SM1 or a second switch SM2. The switches SM1,SM2 are each connected in the supply lines VL1,VL2 and, depending on which switch SM1,SM2 is active, either the automation system in the first rack 1 or the automation system AS2 in the second rack 2 is started.

Thus, while there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An arrangement comprising:

a first rack including a plurality of slots for receiving individual assemblies, which form a first automation system when assembled in a modular manner; and a second rack including a further plurality of slots for receiving further individual assemblies, which form a second automation system when assembled in a modular manner;

wherein a slot of the first rack is formed as a first supply module receptacle with a first contact;

wherein a slot of the second rack is formed as a second supply module receptacle with a second contact;

wherein the first and the second supply module receptacles are constructed such that said first and the second supply module receptacles electrically and structurally complement one another between the first rack and the second rack to form a supply base module;

wherein the first contact is configured to supply the first and the second rack with a supply voltage and the second contact is configured to supply the second and the first rack with the supply voltage, and wherein the supply base module formed by the first and second supply module receptacles is configured to receive a first supply voltage module, a second supply voltage module and a third supply voltage module.

2. The arrangement as claimed in claim 1, wherein the first automation system and the second automation system are each formed as a system for increasing fail-safe operation via a changeover function between the first and second automation systems in an event of a failure on one side of an automation system of the first and second automation systems.

3. The arrangement as claimed in claim 1, further comprising:

a monitor which is configured to record a current system state of each of the first and second automation systems;

wherein the monitor is further configured, following a failure of the first and second automation systems, to support a prioritized startup of an automation system of the first and second automation systems for which a temporally more recent system state is available.

4. The arrangement as claimed in claim 2, further comprising:

a monitor which is configured to record a current system state of each of the first and second automation systems;

wherein the monitor is further configured, following a failure of the first and second automation systems, to support a prioritized startup of the automation system of the first and second automation systems for which a temporally more recent system state is available.

5. The arrangement as claimed in claim 1, wherein the supply base module is constructed in a divisible manner to permit a defective rack to be swapped during operation without failure of a respective other automation system.

6. The arrangement as claimed in claim 2, wherein the supply base module is constructed in a divisible manner to permit a defective rack to be swapped during operation without failure of a respective other automation system.

7. The arrangement as claimed in claim 3, wherein the supply base module is constructed in a divisible manner to permit a defective rack to be swapped during operation without failure of a respective other automation system.

* * * * *